(12) United States Patent
Uchida

(10) Patent No.: US 6,353,912 B1
(45) Date of Patent: Mar. 5, 2002

(54) ENCODING CIRCUIT, ENCODING METHOD, DIGITAL SIGNAL TRANSMITTING APPARATUS, AND DIGITAL SIGNAL RECORDING/REPRODUCING APPARATUS

(75) Inventor: Masaki Uchida, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/193,698

(22) Filed: Nov. 17, 1998

(30) Foreign Application Priority Data

Nov. 21, 1997 (JP) .............................................. 9-321518

(51) Int. Cl.$^7$ ................................................ H03M 7/46
(52) U.S. Cl. ............................. 714/792; 341/58; 341/59
(58) Field of Search ...................... 341/59, 58; 714/792

(56) References Cited

U.S. PATENT DOCUMENTS

| | | | | |
|---|---|---|---|---|
| 4,520,346 A | * | 5/1985 | Shimada .............. | 340/347 DD |
| 5,196,849 A | * | 3/1993 | Galbraith ..................... | 341/59 |
| 5,739,783 A | * | 4/1998 | Tajima ......................... | 341/59 |
| 6,081,210 A | * | 6/2000 | Nikolic et al. ................ | 341/59 |
| 6,084,535 A | * | 7/2000 | Karabed et al. .............. | 341/58 |
| 6,084,536 A | * | 7/2000 | Arts ............................. | 341/58 |
| 6,104,324 A | * | 8/2000 | Kim ............................. | 341/58 |

OTHER PUBLICATIONS

Wolf, "A Survey of Codes for Partial Response Channels", IEEE Trans. on Magnetics, vol. 27, No. 6, Nov. 1991, pp. 4585–4589.*
Zafer et al., "Performance Comparison of Selected DC–Free Codes for PR1–Equalized Magnetic Recording Channels", ICC '97 Montreal, Jun. 1977, pp. 1638–1643.*
Bliss, "An 8/9 Rate Time–Varying Trellis Code for High Density Magnetic Recording", IEEE Trans. on Magnetics, vol. 33, No. 5, Sep. 1997, pp. 2746–2748.*
Ryan et al., "A Study of Class I Partial Response Signaling for Magnetic Recording", IEEE Trans. on Magnetics, vol. 33, No. 6, No. 1997, pp. 4543–4550, Nov. 1997.*

* cited by examiner

*Primary Examiner*—Stephen M. Baker
(74) *Attorney, Agent, or Firm*—Frommer Lawrence & Haug LLP; William S. Frommer; Gordon Kessler

(57) ABSTRACT

An encoding circuit for use with a digital signal transmitting apparatus and a digital signal recording/reproducing apparatus encodes a 16-bit information word into a 18-bit code word by trellis encoding method in the condition that the range of the variation of the ADS is limited in such a manner that the 18-bit code word is composed of a combination of 9-bit sub-code words. Thus, while the channel line density and the circuit scale are being suppressed from increasing, the transmission rate of user data can be improved.

18 Claims, 14 Drawing Sheets

• Sampling Points

Fig. 12

| FIRST TWO BITS OF SUB-CODE t2 | → | FIRST TWO BITS OF SUB-CODE t |
|---|---|---|
| (0, 0) | → | (0, 0) |
| (0, 1) | → | (0, 1) |
| (1, 0) | → | (0, 0) |
| (1, 1) | → | (0, 1) |

Fig. 13

| STATE OF SUB-CODE WORD | SUB-CODE WORD ( 9 BITS,HEXADECIMAL ) |
|---|---|
| A0 | 008 00e 01a 026 032 038 03e 04a 062 068 06e 07a 086 092 098 09e 0c2 0c8 0ce 0da 0e6 0f2 0f8 0fe |
| A1 | 020 0e0 |
| A3 | 080 |
| B0 | 10a 122 128 12e 13a 16a 182 188 18e 19a 1a6 1b2 1b8 1be 1ca 1e2 1e8 1ee |
| Bt0 | 1fa |
| B1 | 1a0 |
| C0 | 009 00c 012 018 01b 01e 021 024 027 030 033 036 039 03c 042 048 04b 04e 05a 063 066 069 06c 072 078 07b 07e 081 084 087 090 093 096 099 09c 0c3 0c6 0c9 0cc 0d2 0d8 0db 0de 0e1 0e4 0e7 0f0 0f3 0f6 0f9 0fc 00f 06f 0cf |
| Ct0 | 006 |
| C1 | 060 |
| C2 | 0c0 |
| C4 | 09f |
| C5 | 03f |
| C7 | 0ff |
| D0 | 108 10b 10e 11a 123 126 129 12c 132 138 13b 13e 14a 162 168 16b 16e 17a 183 186 189 18c 192 198 19b 19e 1a1 1a4 1a7 1b0 1b3 1b6 1b9 1bc 1c2 1c8 1cb 1ce 1da 1e3 1e6 1e9 1ec 1f2 12f 18f 1ef |
| Dh0 | 102 |
| Dt0 | 1f8 1fb 1fe |
| D1 | 120 1e0 |
| D3 | 180 |
| D5 | 1bf |
| E0 | 00d 010 013 016 019 01c 025 031 034 037 03d 043 046 049 04c 04f 052 058 05b 05e 061 064 067 06d 070 073 076 079 07c 085 091 094 097 09d 0c1 0c4 0c7 0cd 0d0 0d3 0d6 0d9 0dc 0e5 0f1 0f4 0f7 0fd |
| E0 | 004 007 |
| Et2 | 040 |
| E4 | 01f 0df |
| E6 | 07f |

Fig. 14

| STATE OF SUB-CODE WORD | SUB-CODE WORD ( 9 BITS, HEXADECIMAL ) |
|---|---|
| F0 | 106 109 10c 10f 112 118 11b 11e 121 124 127 12d 130 133 136 139 13c 142 148 14b 14e 15a 163 166 169 16c 16f 172 178 17b 17e 181 184 187 18d 190 193 196 199 19c 1a5 1b1 1b4 1b7 1bd 1c3 1c6 1c9 1cc 1cf 1d2 1d8 1db 1de 1e1 1e4 1e7 1ed 1f0 1f3 1f6 |
| Fh0 | 103 |
| Ft0 | 1f9 1fc |
| F1 | 160 |
| F2 | 1c0 |
| F4 | 19f |
| F5 | 13f |
| G0 | 011 014 017 01d 035 041 044 047 04d 050 053 056 059 05c 065 071 074 077 07d 095 0c5 0d1 0d4 0d7 0dd 0f5 |
| Gt0 | 005 |
| G4 | 05f |
| H0 | 104 107 10d 110 113 116 119 11c 125 131 134 137 13d 143 146 149 14c 14f 152 158 15b 15e 161 164 167 16d 170 173 176 179 17c 185 191 194 197 19d 1b5 1c1 1c4 1c7 1cd 1d0 1d3 1d6 1d9 1dc 1e5 1f1 1f4 1f7 |
| Hh0 | 101 |
| Ht0 | 1fd |
| H2 | 140 |
| H4 | 11f 1df |
| H6 | 17f |
| I0 | 015 045 051 054 057 05d 075 0d5 |
| J0 | 105 111 114 117 11d 135 141 144 147 14d 150 153 156 159 15c 165 171 174 177 17d 195 1c5 1d1 1d4 1d7 1dd 1f5 |
| J4 | 15f |
| K0 | 055 |
| L0 | 115 145 151 157 15d 175 1d5 |

Fig. 15

| STATE OF SUB-CODE WORD | SUB-CODE WORD t2 |
|---|---|
| A0<br>A1<br>A3 | A0 B0 Bt0 K0(¥) L0(¥) A1 B1 A3<br>A0 B0 Bt0 K0(¥) L0(¥) A1 B1<br>A0 B0 Bt0 K0(¥) L0(¥) |
| B0<br>B1 | A0 B0 Bt0 K0(¥) L0(¥) A1 B1 A3<br>A0 B0 Bt0 K0(¥) L0(¥) A1 B1 |
| C0<br>C1<br>C2<br>C4<br>C5<br>C7 | C0 D0 Ct0 Dt0 I0(¥) J0(¥) C1 D1 C2 C3 C4 C5 D5 J4(¥)<br>C0 D0 Ct0 Dt0 I0(¥) J0(¥) C1 D1 C2 C4 C5 D5 J4(¥)<br>C0 D0 Ct0 Dt0 I0(¥) J0(¥) C1 D1 C4 C5 D5 J4(¥)<br>C0 D0 Ct0 Dt0 I0(¥) J0(¥) C1 D1 C2 C3 C4 C5 D5 J4(¥)<br>C0 D0 Ct0 Dt0 I0(¥) J0(¥) C1 D1 C2 C3 C4 J4(¥)<br>C0(51) D0(24) |
| D0<br>Dh0<br>D1<br>D3<br>D5 | C0 D0 Ct0 Dt0 I0(¥) J0(¥) C1 D1 C2 C3 C4 C5 D5 J4(¥)<br>C0 D0 Ct0 Dt0 I0(¥) J0(¥) C1 D1 C2 C3 C4 C5 D5 J4(¥)<br>C0 D0 Ct0 Dt0 I0(¥) J0(¥) C1 D1 C2 C4 C5 D5 J4(¥)<br>C0 D0 Ct0 Dt0 I0(¥) J0(¥) C4 C5 D5 J4(¥)<br>C0 D0 Ct0 Dt0 I0(¥) J0(¥) C1 D1 C2 C3 C4 J4(¥) |
| E0<br>E2<br>E4<br>E6 | E0 F0 Ft0 G0(¥) H0(¥) Gt0(¥) Ht0(¥) F1 E2 F2 H2(¥) E4 F4 F5 E6 G4(¥) H4(¥) H6(¥)<br>E0 F0 Ft0 G0(¥) H0(¥) Gt0(¥) Ht0(¥) F1 E4 F4 F5 E6 G4(¥) H4(¥) H6(¥)<br>E0 F0 Ft0 G0(¥) H0(¥) Gt0(¥) Ht0(¥) F1 E2 F2 H2(¥) E4 F4 F5 G4(¥) H4(¥)<br>E0 F0 Ft0 G0(¥) H0(¥) Gt0(¥) Ht0(¥) F1 E2 F2 H2(¥) |
| F0<br>Fh0<br>F1<br>F2<br>F4<br>F5 | E0 F0 Ft0 G0(¥) H0(¥) Gt0(¥) Ht0(¥) F1 E2 F2 H2(¥) E4 F4 F5 E6 G4(¥) H4(¥) H6(¥)<br>E0 F0 Ft0 G0(¥) H0(¥) Gt0(¥) Ht0(¥) F1 E2 F2 H2(¥) E4 F4 F5 E6 G4(¥) H4(¥) H6(¥)<br>E0 F0 Ft0 G0(¥) H0(¥) Gt0(¥) Ht0(¥) F1 E2 F2 H2(¥) E4 F4 F5 E6 G4(¥) H4(¥) H6(¥)<br>E0 F0 Ft0 G0(¥) H0(¥) Gt0(¥) Ht0(¥) F1 E4 F4 F5 E6 G4(¥) H4(¥) H6(¥)<br>E0 F0 Ft0 G0(¥) H0(¥) Gt0(¥) Ht0(¥) F1 E2 F2 H2(¥) E4 F4 F5 G4(¥) H4(¥)<br>E0 F0 Ft0 G0(¥) H0(¥) Gt0(¥) Ht0(¥) F1 E2 F2 H2(¥) E4 F4 G4(¥) H4(¥) |
| G0<br>G4 | E0(¥) F0(¥) Et0(¥) Ft0(¥) G0 H0 Gt0 Ht0 F1(¥) E2(¥) F2(¥) H2 E4(¥) F4(¥) F5(¥) E6(¥) G4 H4 H6<br>E0(¥) F0(¥) Et0(¥) Ft0(¥) G0 H0 Gt0 Ht0 F1(¥) E2(¥) F2(¥) H2 E4(¥) F4(¥) F5(¥) G4 H4 |
| H0<br>Hh0<br>H2<br>H4<br>H6 | E0(¥) F0(¥) Et0(¥) Ft0(¥) G0 H0 Gt0 Ht0 F1(¥) E2(¥) F2(¥) H2 E4(¥) F4(¥) F5(¥) E6(¥) G4 H4 H6<br>E0(¥) F0(¥) Et0(¥) Ft0(¥) G0 H0 Gt0 Ht0 F1(¥) E2(¥) F2(¥) H2 E4(¥) F4(¥) F5(¥) E6(¥) G4 H4 H6<br>E0(¥) F0(¥) Et0(¥) Ft0(¥) G0 H0 Gt0 Ht0 F1(¥) E2(¥) F2(¥) F5(¥) E6(¥) G4 H4 H6<br>E0(¥) F0(¥) Et0(¥) Ft0(¥) G0 H0 Gt0 Ht0 F1(¥) E2(¥) F2(¥) H2 E4(¥) F4(¥) F5(¥) G4 H4<br>E0(¥) F0(¥) Et0(¥) Ft0(¥) G0 H0 Gt0 Ht0 F1(¥) E2(¥) F2(¥) H2 |
| I0 | C0(¥) D0(¥) Ct0(¥) Dt0(¥) I0 J0 C1(¥) D1(¥) C2(¥) D3(¥) C4(¥) C5(¥) D5(¥) J4 |
| J0<br>J4 | C0(¥) D0(¥) Ct0(¥) Dt0(¥) I0 J0 C1(¥) D1(¥) C2(¥) D3(¥) C4(¥) C5(¥) D5(¥) J4<br>C0(¥) D0(¥) Ct0(¥) Dt0(¥) I0 J0 C1(¥) D1(¥) C2(¥) D3(¥) C4(¥) C5(¥) D5(¥) J4 |
| K0 | A0(¥) B0(¥) Bt0(¥) K0 L0 A1(¥) B1(¥) A3(¥) |
| L0 | A0(¥) B0(¥) Bt0(¥) K0 L0 A1(¥) B1(¥) A3(¥) |

Fig. 16
| STATE OF SUB-CODE WORD | FIRST BIT OF SUB-CODE t2 | STATE OF NEXT CODE WORD |
|---|---|---|
| $S_0$ | 0 | $S_1$ |
|  | 1 | $S_0$ |
| $S_1$ | 0 | $S_0$ |
|  | 1 | $S_1$ |
Fig. 17
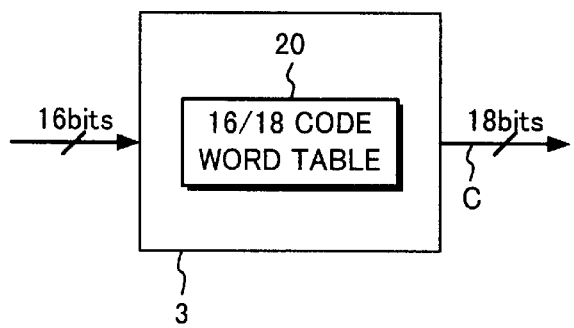
Fig. 18
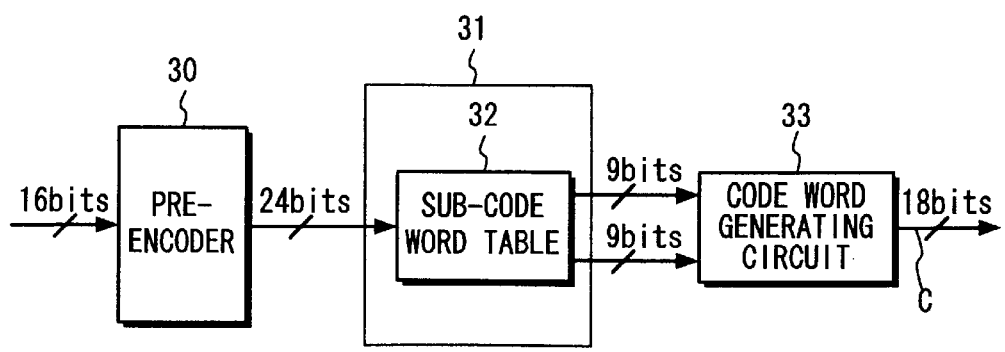

ENCODING CIRCUIT, ENCODING METHOD, DIGITAL SIGNAL TRANSMITTING APPARATUS, AND DIGITAL SIGNAL RECORDING/REPRODUCING APPARATUS

BACKGROUND OF THE INVENTION

1. Field of the Invention

The present invention relates to an encoding circuit, an encoding method, a digital signal transmitting apparatus, and a digital signal recording/reproducing apparatus.

2. Description of the Related Art

Trellis coded partial response method is an effective method as a signal processing method so as to record a digital signal in a high density to some recording medium, such as a magnetic medium. The Trellis coded partial response method is a combination of a partial response and a maximum-likelihood decoding process, that is performed with a restriction condition of a modulation code.

Extended partial response class 4 (referred to as EPR4) has been conventionally used as a partial response. In EPR4, an equalized waveform of a di-pulse response is expressed as (1, 1, −1, −1) at a sample point (symbol point). The system polynomial of EPR4 is expressed as Formula (1).

$$G(D)=(1-D)(1+D)^2 \quad (1)$$

where D is a one-bit delay operator.

Next, trellis coded extended partial response class 4 (hereinafter referred to as TCEPR4) will be described. TCEPR4 is used to perform the maximum-likelihood decoding process using EPR4 and a restriction condition of a modulation code. FIG. 1 shows an example of the structure of a circuit that performs TCEPR4. Input data I to be recorded is supplied to an encoder 201. The encoder 201 performs a predetermined encoding process for the input data I and outputs encoded data CO. The encoded data CO is supplied to a magnetic recording channel 202.

A circuit that converts input data into binary data is disposed upstream of the encoder 201. The input data I is binary data. The magnetic recording channel 202 contains a recording circuit, a recording magnetic head, a magnetic record medium, a reproducing head, and a reproducing circuit. The recording circuit processes the encoded data CO so as to record the input data I to the magnetic record medium. In other words, the magnetic recording channel 202 is a portion that writes/records data to/from the magnetic record medium.

An equalizer 203 equalizes a signal reproduced from the magnetic record medium through the magnetic recording channel 202. An output signal of the equalizer 203 is supplied to a maximum-likelihood decoder 204. The maximum-likelihood decoder 204 performs a maximum-likelihood decoding process for the output signal of the equalizer 203. A decoder 205 disposed downstream of the maximum-likelihood decoder 204 finally reproduces information recorded on the magnetic record medium. In reality, after a digital process is performed for sampled data that has been A/D converted, a reproducing process is performed downstream of the magnetic recording channel 202.

An output signal of the equalizer 203 (namely, a signal that has been reproduced and equalized by the magnetic recording channel 202) (this output signal is hereinafter referred to as a reproduced/equalized signal) has five levels of (−2, −1, 0, +1, and +2). FIG. 2 shows an example of the reproduced/equalized signal. To restore the reproduced/equalized signal into binary data (namely, the encoded data that has not been recorded/reproduced by the magnetic recording channel 202), Viterbi decoding process that is one kind of maximum-likelihood decoding process is used.

In the Viterbi decoding process, the maximum-likelihood sequence (path) is estimated as reproduced encoded data based on a result of a calculating process with available sequences of sampled data. Thus, the Viterbi decoding process has a high detecting performance. However, depending on a sequence of the reproduced/equalized signal, the maximum-likelihood sequence may not be easily settled corresponding to the results of the above-described calculating process. In this case, the calculated results are stored in a memory of the Viterbi decoder until the maximum-likelihood sequence is settled. Thus, if the length of an unsettled sequence (namely, the length of a sequence that is calculated until the maximum-likelihood sequence is settled) exceeds the memory length, the memory overflows and thereby an error takes place.

As an example of which the memory overflows, a maximum-likelihood sequence estimated from some types of sequences of values of a reproduced/equalized signal is not eternally settled. Such a sequence is referred to as quasi catastrophic sequence. In addition, before a sequence is settled as the maximum-likelihood sequence, if the length of an unsettled sequence exceeds the memory length, the memory overflows. Thus, when the quasi catastrophic sequence is removed and the length of an unsettled sequence is limited to the memory length, the memory can be prevented from overflowing.

An object of the channel encoding process is to trim a signal spectrum and limit the number of successive "0s" so as to improve the accuracy for extracting clock information. Another object of the channel encoding process is to prevent the memory from overflowing.

In recording/reproducing mode, the channel encoding process is performed in the following manner. Binary data to be recorded (hereinafter referred to as information word) is converted into binary data (hereinafter referred to as record word) corresponding to a predetermined conversion rule. The record word is recorded/reproduced to/from the magnetic recording channel 202. In the reproducing mode, data that has been decoded by the above-described maximum-likelihood decoding process is inversely converted and the original information word is reproduced. (When there is no encoded error, the data decoded by the maximum-likelihood decoding process matches the record word).

In FIG. 1, the information word is I and the record word is CO. The predetermined conversion rule is an encoding rule performed by the encoder 201. In the reproducing system, the decoder 205 performs a decoding process as an inversely converting process for data that has been decoded by the maximum-likelihood decoder 204 and thereby reproduces the original information word.

On the other hand, since the system polynomial of TCEPR4 is expressed as Formula (1), the transfer function of the TCEPR4 channel is a spectrum of which the Nyquist frequency is null. When data is encoded, a code conversion is performed in such a manner that the frequency component of the Nyquist frequency in the power spectrum density of the record current of which "1" and "0" of a code word sequence are recorded corresponding to the direction of the current becomes null. At the frequency of which the frequency component of the transfer function of the channel is null, data is encoded in such a manner that the frequency component of the power spectrum density of the code word sequence becomes null. Thus, the signal detection gain of decoded data can be improved.

To prevent the memory from overflowing in the Viterbi decoding process and improve the signal detection gain, the following encoding process is performed. In other words, by limiting the range of the variation of ADS (Alternating Digital Sum), data can be encoded in such a manner that the Nyquist frequency component becomes null. In TCEPR4, a code word that satisfies the limitation of the range of the variation of the ADS is used.

Assuming that the total number of bits of the input binary data is denoted by n, the ADS of a sequence {a1, . . . , an} is expressed as Formula (2).

$$ADS = \sum_{i=1}^{n}(-1) \qquad (2)$$

For example, when data is encoded corresponding to an encoding state transition chart shown in FIG. 3, a code word sequence of which the range of the variation of the ADS is limited to up to eight is generated. Under such a limitation, the square of the minimum Euclidean distance between sequences that are output from the TCEPR4 channel becomes six. Thus, a high signal detection gain can be obtained.

FIG. 4 shows an example of a trellis available with a code word of for example 10 bits in the case that data is encoded in the condition that the range of the variation of the ADS is limited to up to eight. However, in a code word sequence generated with the trellis shown in FIG. 4, the length of an unsettled sequence is not sufficiently decreased. Thus, as described above, there is a probability of which the memory of the Viterbi decoder overflows. Thus, the encoding process should be performed with more restrictions.

For example, when a method for shifting the encoding state at the boundary (length) of a code word is used as shown in FIG. 5, with a path memory whose length is around four times larger than the length of a code word, the memory can be prevented from overflowing. In the conventional 8/10 encoding process of which an information word of eight bits is converted into a code word of 10 bits, the encoding state is shifted. In such an encoding process, the range of the variation of the ADS is limited to up to eight. In addition, a sequence of the Viterbi decoding circuit can be settled.

Conventionally, in the 8/10 encoding process with low encoding ratio, an encoding method with the above-described conditions is used so as to prevent the memory of the Viterbi decoder from overflowing and to improve the signal detection gain. In such an encoding method, to increase the transmission rate of user data, the channel line density should be increased. However, as the channel line density increases, the inter-code interference increases. Thus, the characteristics of the reproduced signal remarkably deteriorate.

On the other hand, when the channel line density is the same as that of another encoding method, the transmission rate of user data decreases. When such an encoding method with low transmission rate of user data is applied to a magnetic recording/reproducing apparatus or the like, the record capacitance of user data decreases.

OBJECTS AND SUMMARY OF THE INVENTION

An object of the present invention is to provide an encoding circuit, an encoding method, a digital signal transmitting apparatus, and a digital signal recording/reproducing apparatus that allow the transmission rate of user data to improve without need to increase the channel line density or with suppressing the necessity of the increase of the channel line density.

A first aspect of the present invention is an encoding circuit for performing a channel encoding process that is a combination of a partial response and a maximum-likelihood decoding process, comprising a means for converting a binary data sequence of 16-bit information words into a binary data sequence of 18-bit code words in the conditions that the range of variation of ADS of the code word sequence is limited to up to 10, that a quasi catastrophic sequence is removed, and that the maximum zero run length of the code word sequence is limited to up to 10.

A second aspect of the present invention is an encoding circuit for performing a channel encoding process that is a combination of a partial response and a maximum-likelihood decoding process, comprising a means for converting a 16-bit information word of a binary data sequence into a 18-bit code word of a binary data sequence so that the 18-bit code word is generated as a combination of 9-bit sub-code words composed of a binary data sequence, a means for defining a set of 9-bit sub-code words, a combination information generating means for converting a 16-bit information word of a binary data sequence into combination information that represents a combination of sub-code words of the set, a sub-code word generating means, having storing means for storing the set of sub-code words, for selecting two sub-code words from the set stored in the storing means corresponding to the combination information and for outputting the selected sub-code words, and a code word generating means for generating the code word corresponding to output data of the sub-code word generating means.

A third aspect of the present invention is an encoding method for performing a channel encoding process that is a combination of a partial response and a maximum-likelihood decoding process, comprising the step of converting a binary data sequence of 16-bit information words into a binary data sequence of 18-bit code words in the conditions that the range of variation of ADS of the code word sequence is limited to up to 10, that a quasi catastrophic sequence is removed, and that the maximum zero run length of the code word sequence is limited to up to 10.

A fourth aspect of the present invention is a digital signal transmitting apparatus having an encoding circuit for performing a channel encoding process that is a combination of a partial response and a maximum-likelihood decoding process, wherein the encoding circuit comprises a means for converting a binary data sequence of 16-bit information words into a binary data sequence of 18-bit code words in the conditions that the range of variation of ADS of the code word sequence is limited to up to 10, that a quasi catastrophic sequence is removed, and that the maximum zero run length of the code word sequence is limited to up to 10.

A fifth aspect of the present invention is a digital signal recording/reproducing apparatus having an encoding circuit for performing a channel encoding process that is a combination of a partial response and a maximum-likelihood decoding process, wherein the encoding circuit comprises a means for converting a binary data sequence of 16-bit information words into a binary data sequence of 18-bit code words in the conditions that the range of variation of ADS of the code word sequence is limited to up to 10, that a quasi catastrophic sequence is removed, and that the maximum zero run length of the code word sequence is limited to up to 10.

According to the first to fourth aspects of the present invention, since a 16/18 encoding process that has higher encoding ratio than the conventional 8/10 encoding process is performed with conditions of which a memory of a Viterbi decoder is prevented from overflowing and of which a signal detection gain is improved, the Viterbi decoding process can be properly performed. In addition, the transmission rate can be improved without need to improve the channel line density.

In addition, since a code of which the zero run length is limited to up to 10, a clock signal can be stably reproduced from a reproduction signal.

According to the present invention, a 16-bit information word is converted into a 18-bit code word. Moreover, since the 18-bit code word is represented with a combination of 9-bit sub-code words, the hardware scale necessary for generating a 18-bit code word corresponding to a 16-bit information word can be reduced.

According to the fifth aspect of the present invention, the storage capacity for user data can be increased in comparison with the conventional encoder using codes having low encoding ratio such as 8/10 codes without need to improve the channel line density.

These and other objects, features and advantages of the present invention will become more apparent in light of the following detailed description of a best mode embodiment thereof, as illustrated in the accompanying drawings.

BRIEF DESCRIPTION OF THE DRAWINGS

FIG. 12 is a schematic diagram for explaining a conversion to a sub-code word for shifting a state in an encoding trellis;

FIG. 13 is a schematic diagram showing an example of a partial set of sub-code words according to an embodiment of the present invention;

FIG. 14 is a schematic diagram showing an example of a partial set of sub-code words according to an embodiment of the present invention;

FIG. 15 is a schematic diagram for explaining a combination of partial sets for properly selecting a sub-code word;

FIG. 16 is a schematic diagram for explaining a transition of states of a code word according to an embodiment of the present invention;

FIG. 17 is a schematic diagram for explaining an example of an encoding circuit according to an embodiment of the present invention; and FIG. 18 is a schematic diagram for explaining another example of an encoding circuit according to an embodiment of the present invention.

DETAILED DESCRIPTION OF THE PREFERRED EMBODIMENTS

Figure 1:
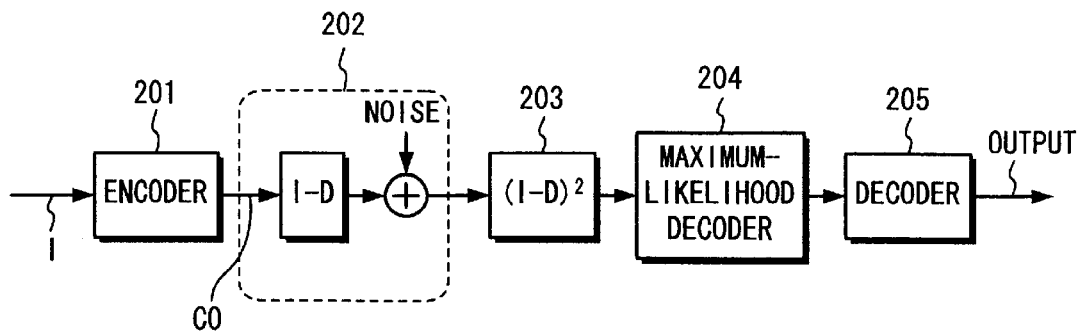
FIG. 1 is a block diagram for explaining an example of a conventional TCEPR4 channel.
Figure 2:
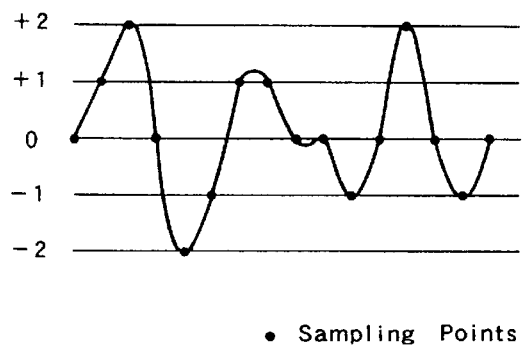
FIG. 2 is a schematic diagram for explaining a reproduced/equalized signal processed in the conventional TCEPR4 channel.
Figure 3:
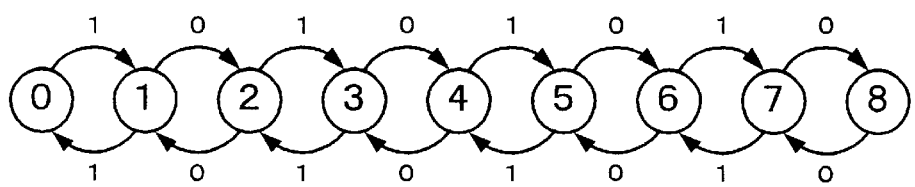
FIG. 3 is a schematic diagram for explaining a state transition used in the conventional TCEPR4 channel in the case that the range of the variation of the ADS is limited to up to eight.
Figure 4:
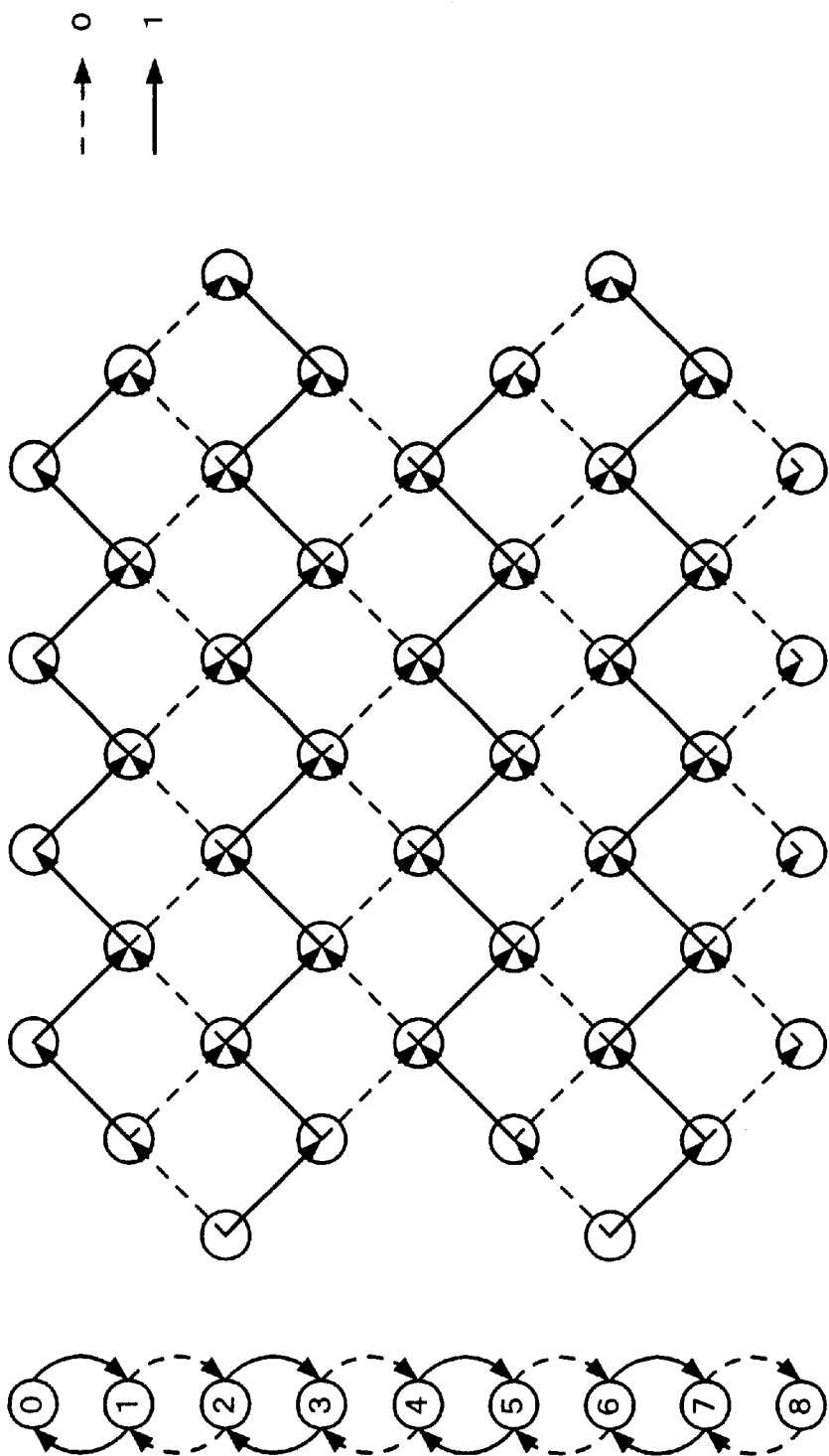
FIG. 4 is a schematic diagram for explaining an encoding trellis structure used in the conventional TCEPR4 channel in the case that the range of the variation of the ADS is limited to up to eight.
Figure 5:
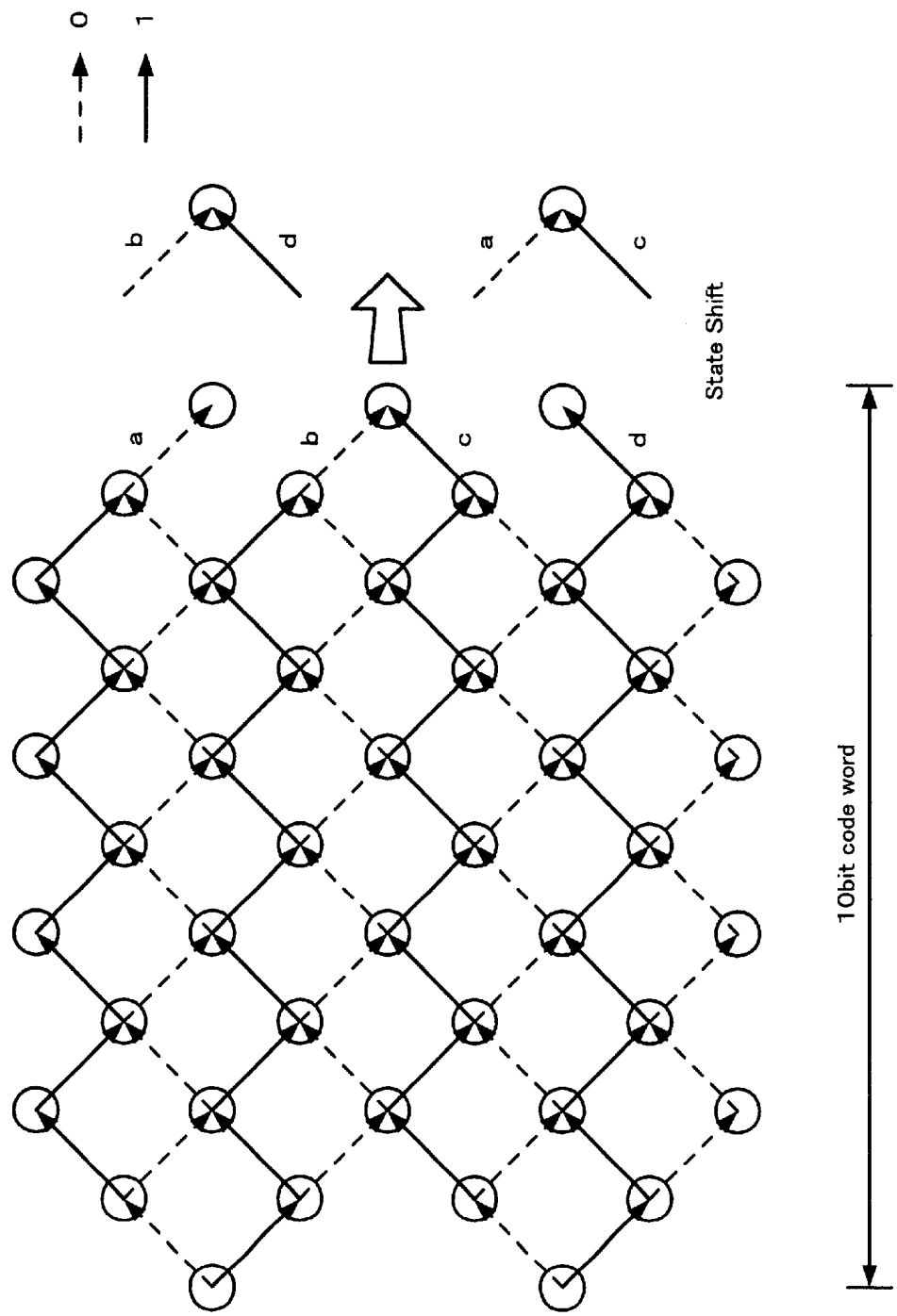
FIG. 5 is a schematic diagram for explaining an encoding trellis structure used in the conventional TCEPR4 channel in the case that the range of the variation of the ADS is limited to up to eight and the states shift.
Figure 6:
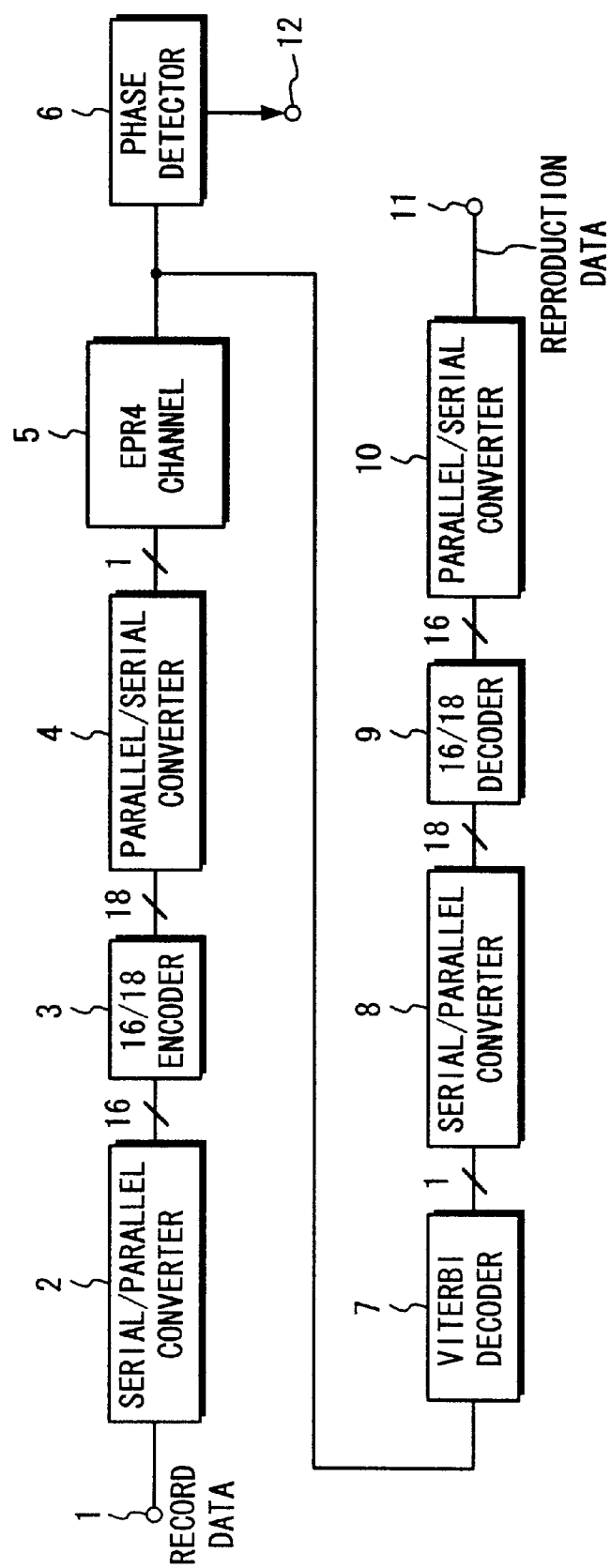
FIG. 6 is a block diagram for explaining the structure of a digital magnetic recording apparatus according to an embodiment of the present invention.

Next, with reference to the accompanying drawings, embodiments of the present invention will be described. FIG. 6 shows an example of the structure of a digital magnetic recording apparatus according to an embodiment of the present invention. Data to be recorded is supplied from an input terminal 1. The input data is supplied to an EPR4 channel 5 through a serial/parallel converter (hereinafter referred to as S/P converter) 2, a 16/18 encoder 3, and a parallel/serial converter (hereinafter referred to as P/S converter) 4. Output data of the EPR4 channel 5 is supplied to a phase detector 6 and a Viterbi decoder 7. The Viterbi decoder 7 is a maximum-likelihood decoder. Output data of the Viterbi decoder 7 is supplied from an output terminal 11 through an S/P converter 8, a 16/18 decoder 9, and a P/S converter 10 corresponding to the output data of the EPR4 channel 5.

The EPR4 channel 5 contains a recording circuit, a recording magnetic head, a magnetic record medium, a reproducing head, and a reproducing circuit. In other words, the EPR4 channel 5 is a portion that reads/writes data from/to a magnetic record medium.

Next, the recording system will be described in detail. The S/P converter 2 converts the input data into 16-bit data and supplies the resultant data to the 16/18 encoder 3. The 16/18 encoder 3 encodes the 16-bit data and outputs a 18-bit code word. The P/S converter 4 converts the 18-bit code word into a serial data sequence and supplies the serial data sequence to the EPR4 channel 5.

Next, the reproducing system of the digital magnetic recording apparatus according to the present invention will be described. The EPR4 channel 5 performs an equalizing process for a reproduction signal reproduced from the magnetic record medium by the magnetic head or the like so that a di-pulse response matches (1, 1, −1, −1) that is the EPR4 standard. The EPR4 channel 5 finally outputs a digital signal sample that is generated as a result of the equalizing process described above. The phase detector 6 detects the phase of the output data of the EPR4 channel 5. Synchronous information that is output from the phase detector 6 is supplied to a synchronizing circuit (not shown) through an output terminal 12.

The Viterbi decoder 7 performs the maximum-likelihood decoding process for the digital signal sample received from the EPR4 channel 5 and supplies the maximum-likelihood decoded data to the S/P converter 8. The S/P converter 8 converts the maximum-likelihood decoded data into 18-bit data and supplies the resultant data to the 16/18 decoder 19. The 16/18 decoder 9 decodes the 18-bit data into 16-bit decode word data and supplies the 16-bit decode word data to the P/S converter 10. The P/S converter 10 converts the 16-bit decode word data received from the 16/18 decoder 9 into a serial data sequence and supplies the serial data sequence to the outside through an output terminal 11.

Figure 7:
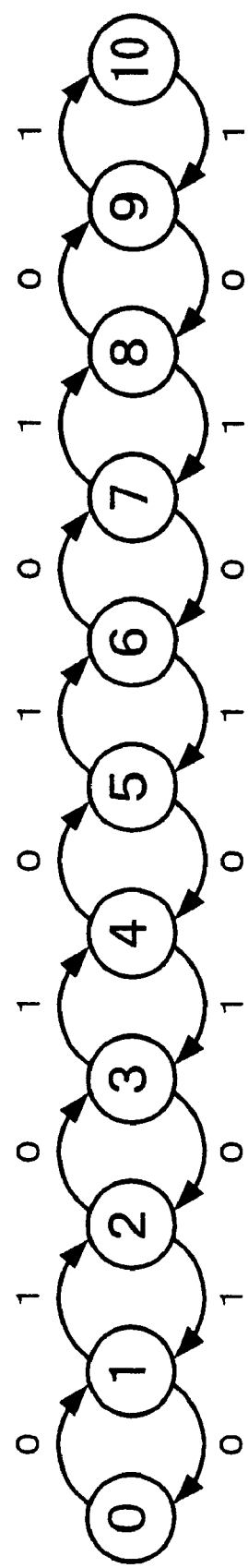
FIG. 7 is a schematic diagram for explaining an example of a state transition in the case that the range of the variation of the ADS is limited to up to 10.
Figure 8:
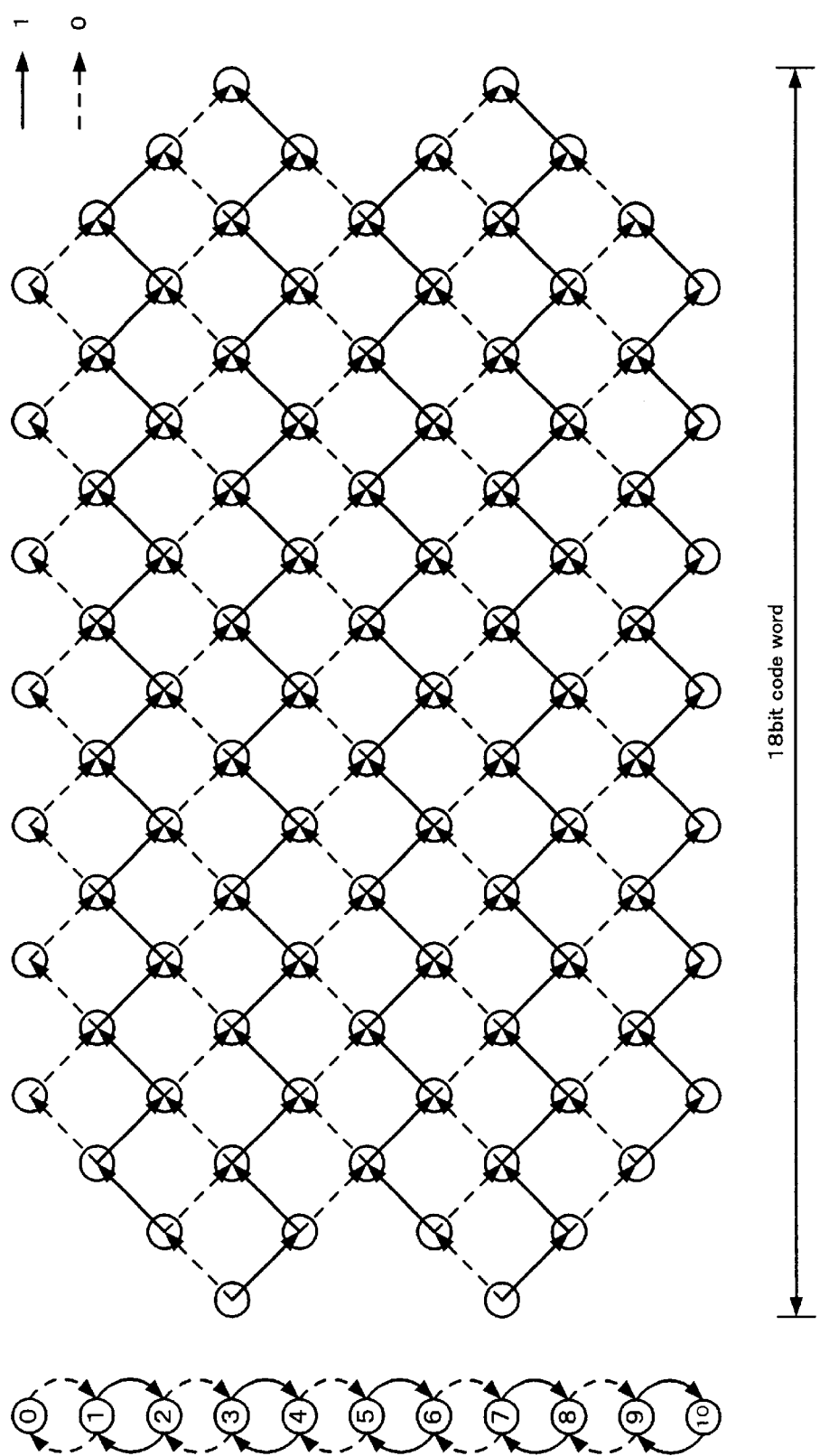
FIG. 8 is a schematic diagram for explaining the structure of an encoding trellis in the case that the range of the variation of the ADS is limited to up to 10.
Figure 9:
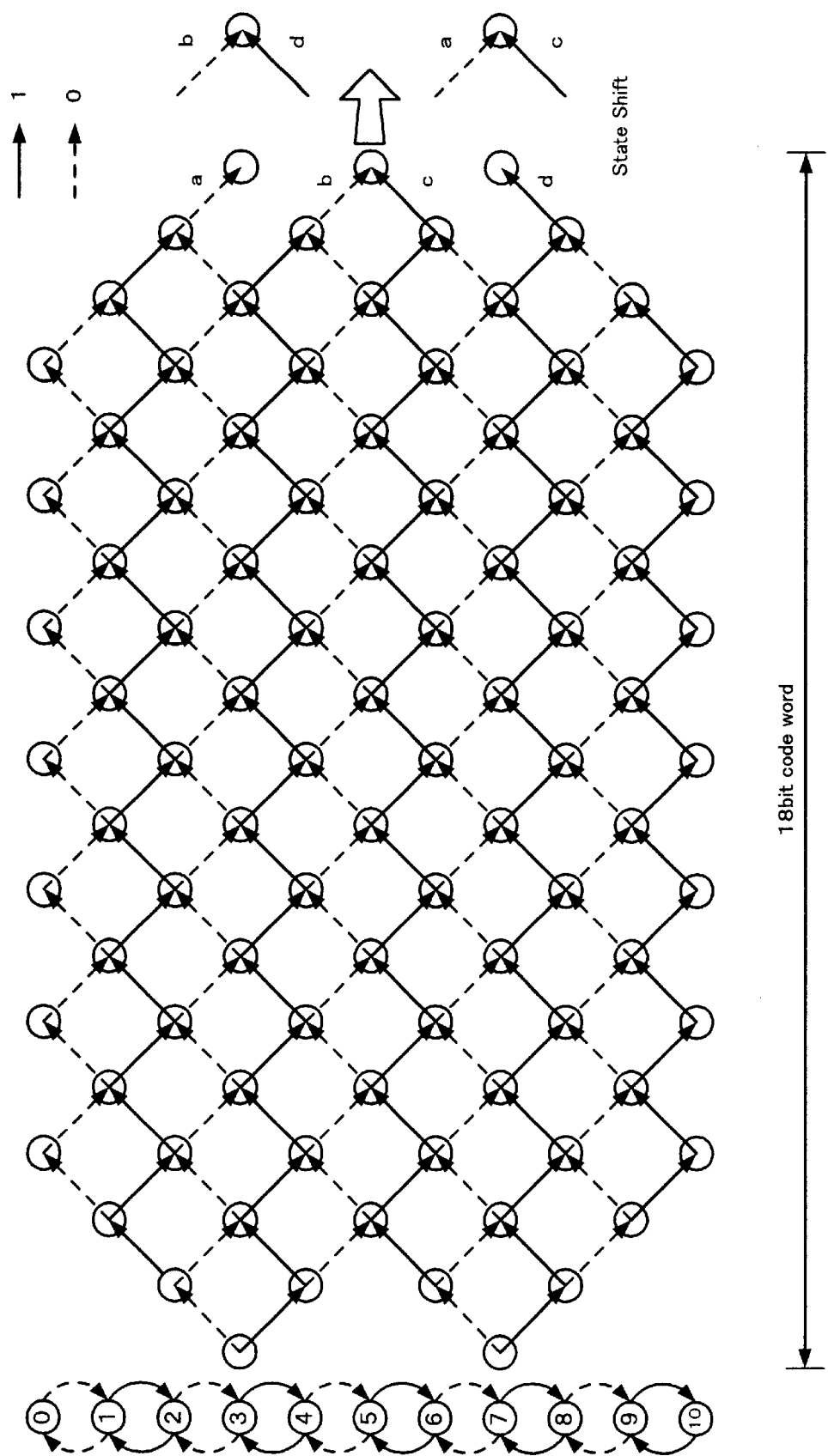
FIG. 9 is a schematic diagram for explaining the structure of an encoding trellis in the case that the range of the variation of the ADS is limited to up to 10 and that the status shift.

Next, the theory of the operation of the 16/18 encoder 3 will be described. FIG. 7 shows an encoded state transition chart used to select a code word corresponding to a 16-bit information word. In the encoded state transition chart shown in FIG. 7, the range of the variation of the ADS is limited to up to 10. FIG. 8 shows a trellis transition chart of a 18-bit code word that starts with code states 3 and 7 and ends with code states 3 and 7. FIG. 9 shows a trellis transition chart of which the 18-bit code word shown in FIG. 8 ends with code states 3, 5, and 7 and the states thereof shift at the boundary.

Since the states of the code word shift at the boundary, a sequence that causes the path memory of the Viterbi decoder to overflow is removed. In this encoding method, a sequence that causes the path memory of the Viterbi decoder to overflow continues two times the length of the code word. Thus, the path memory of the Viterbi decoder requires 32 bits. However, when a cross transition is permitted in a trellis in the maximum-likelihood decoding process, the path memory requires 72 bits.

Figure 10:
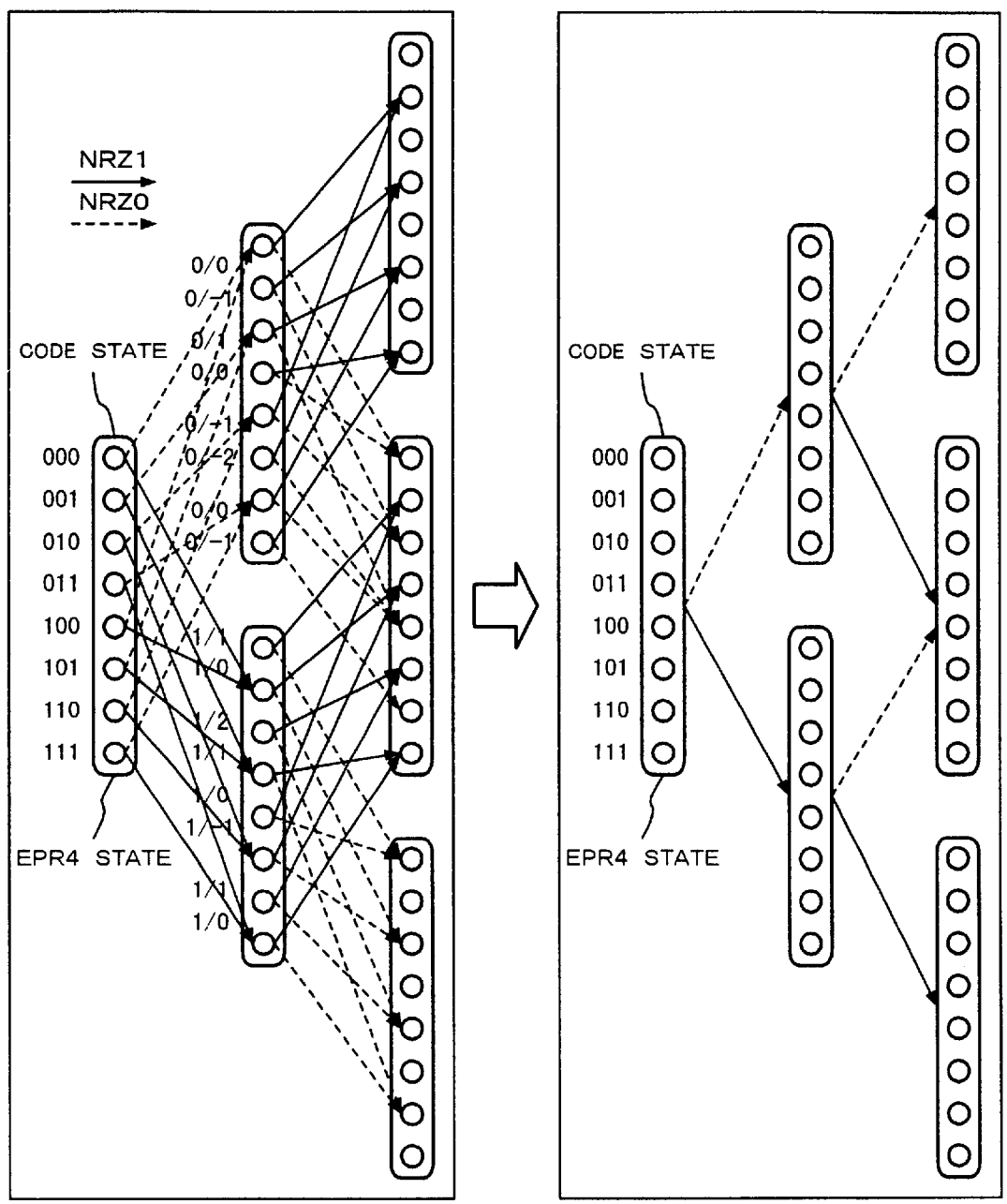
FIG. 10 is a schematic diagram for explaining a part of a trellis transition of a Viterbi decoder according to an embodiment of the present invention.
Figure 11:
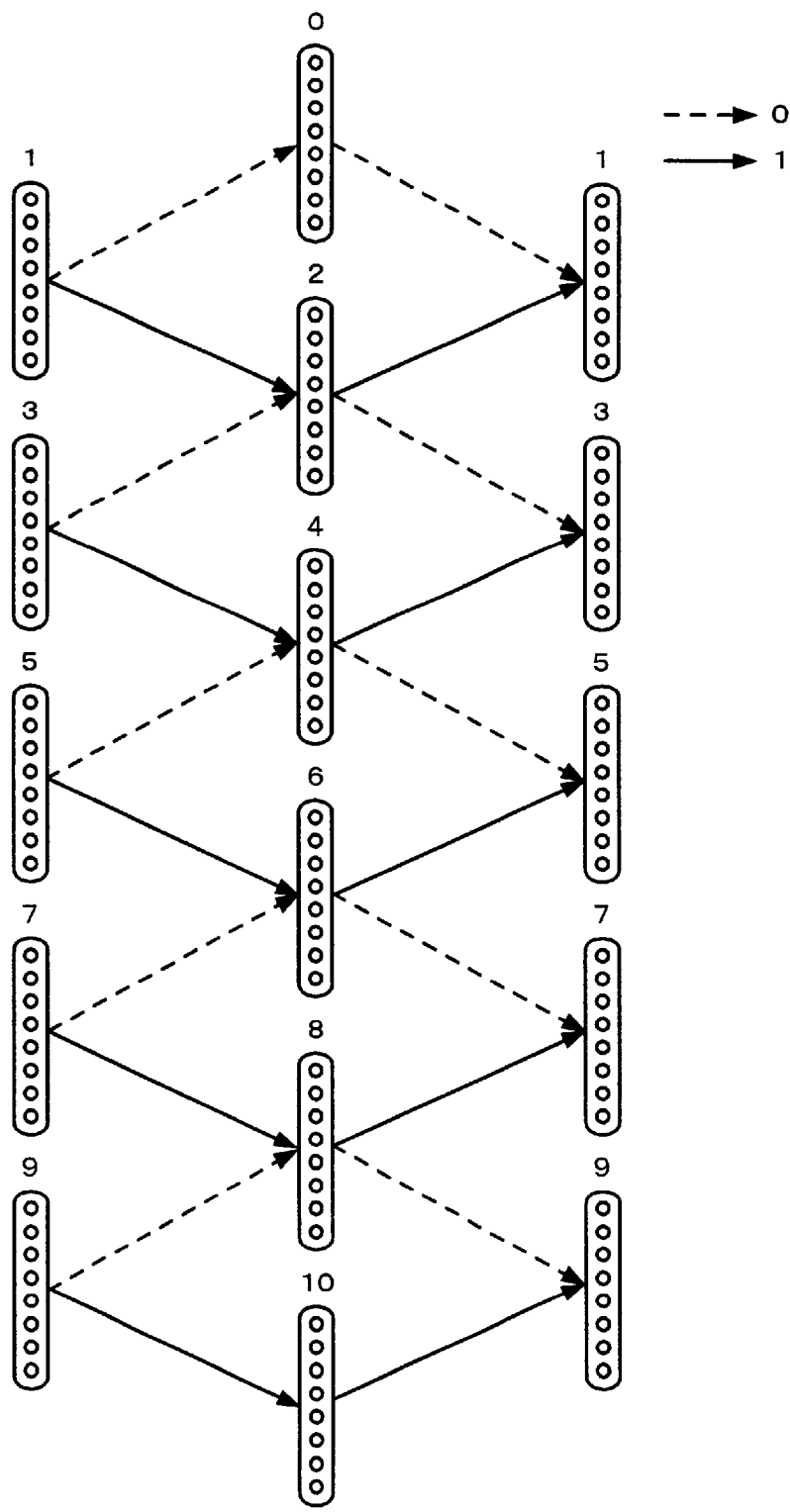
FIG. 11 is a schematic diagram for explaining a trellis transition of a Viterbi decoder according to an embodiment of the present invention.

FIGS. 10 and 11 show a trellis structure of the Viterbi decoder 7. FIG. 10 shows a trellis transition of which the Viterbi decoder traces a two-bit reproduction signal. The right-side chart of FIG. 10 shows that eight states of an output sequence of the EPR4 channel $(1-D)(1+D)^2$ are represented as the following code word trellis. (000), (001), (010), (011), (100), (101), (110), (111)

A set of eight states corresponds to one code state. In FIG. 10, an arrow with a solid line represents a state transition in the case that NRZ (namely, the encoder output) is 1, whereas an arrow with a dotted line represents a state transition in the case that NRZ is 0. Numerals associated with each arrow represent (NRZ/EPR4 channel output). For example, (0/−1) represents that when the output data of the EPR4 channel (namely, the input data of the Viterbi decoder) is −1, the output data of the Viterbi decoder (namely, the input data of the 16/18 decoder) is 0.

The right-side diagram of FIG. 10 is a simplified diagram of the left-side diagram of FIG. 10. In other words, eight state transitions that take place when NRZ is 1 are represented with one solid line. Likewise, eight state transitions that take place when NRZ is 0 are represented with one dotted line. Thus, the operation of the Viterbi decoder 7 is represented as repetition of trellis transitions shown in FIG. 11. The trellis state numbers shown in FIG. 11 correspond to the state numbers of the encoded state transition diagram shown in FIG. 7. The Viterbi decoder 7 that accomplishes such an operation contains a calculation processing circuit and a parallel load/serial shift register. The calculation processing circuit performs a calculation process corresponding to output data of the EPR4 channel 5. The parallel load/serial shift register is connected corresponding to the above-described trellis structure.

To stably reproduce a clock signal, the encoding process should be performed in such a manner that the maximum zero run length is limited. As an example of the encoding method with such a limitation, a code word space that satisfies the range of the variation of the ADS is converted into a sub-code word space. In the sub-code word space, state transitions are considered.

A 18-bit code word c is defined as Formula (3). As described above, the code word c satisfies the trellis transitions of which the range of the variation of the ADS is limited to up to 10 as shown in FIG. 9. In addition, the code word c satisfies a condition of which the zero run length is limited to up to 10.

$$\text{code word } c=(c0, c1, c2, c3, c4, c5, c6, c7, c8, c9, c10, c11, c12, c13, c14, c15, c16, c17) \quad (3)$$

The code word c is composed of a combination of a sub-code word h and a sub-code word t. The sub-code word h is selected from a set of 9-bit sub-code words. The sub-code word t is obtained by performing a particular process for a sub-code word selected from a set of similar sub-code words. The set of sub-code words has been stored in a particular memory of the 16/18 encoder in consideration that the code word c satisfies the above-described conditions (see FIGS. 13 and 14). The code word c is generated as the following combination.

$$\text{code word } c=(h, t(\#)) \quad (4)$$

In this case, when a bit sequence is denoted by a, a bit sequence of which the bit order of the bit sequence a is inverted is denoted by a(#). Thus, t(#) in Formula (4) represents that the bit order of the bit sequence t is inverted. With Formulas (3) and (4), sub-code words h and t are expressed by Formulas (5) and (6), respectively.

$$\text{sub-code word } h=(c0, c1, c2, c3, c4, c5, c6, c7, c8) \quad (5)$$

$$\text{sub-code word } t=(c17, c16, c15, c14, c13, c12, c11, c10, c9) \quad (6)$$

The first two bits (c17 and c16) of the sub-code word t represent that the first two bits of a sub-code word t2 are converted as shown in FIG. 12 corresponding to code states at the end of a code word that are converted into 3, 5, and 7 as shown in FIG. 9. Next, a method for generating the code word c will be described with reference to a practical example that follows. It is assuming that a sub-code word h selected from a set of sub-code words and a sub-code word t2 selected from the same set of sub-code words are represented as follows.

$$\text{sub-code word } h=(0, 1, 1, 0, 1, 0, 0, 0, 1) \quad (7)$$

$$\text{sub-code word } t2=(1, 0, 1, 1, 1, 0, 1, 0, 0) \quad (8)$$

At this point, corresponding to the conversion shown in FIG. 12, the sub-code word t2 is converted into the following sub-code word t.

$$\text{sub-code word } t=(0, 0, 1, 1, 1, 0, 1, 0, 0) \quad (9)$$

Thus, the following code word c can be obtained with Formula (3).

$$\text{code word } c=(0, 1, 1, 0, 1, 0, 0, 0, 1, 0, 0, 1, 0, 1, 1, 1, 0, 0) \quad (10)$$

FIGS. 13 and 14 show a set of sub-code words in the condition that the range of the variation of the ADS for the code word c is limited to up to 10. In this example, the set of sub-code words is divided into 45 partial sets. FIG. 15 shows combinations of which the sub-code word t2 is selected from one of the 45 partial sets in the case that the sub-code word h is selected from the 45 partial sets. For example, when the sub-code word h is selected from a partial set A0, the sub-code word t2 is selected from elements of partial sets A0, B0, Bt0, K0(¥), L0(¥), A1, B1, and A3. The partial sets are defined in the condition that the zero run length of the code word c is limited to up to 10.

A partial set with (¥) represents that the bit order of elements of the partial set is inverted. For example, K0(¥) represents a set of element 005(¥) of which the bit order of elements 055 of the partial set K0 is inverted.

In reality, in the case that 008 (hexadecimal notation) are selected as the sub-code word h from the partial set A0, when 10a (hexadecimal notation) are selected as the sub-code word t2 from the partial set B0, the code word c is represented as 010a1 (hexadecimal notation). Likewise, in the case that 008 (hexadecimal notation) are selected as the sub-code word h from the partial set A0, when 055(¥) are selected as the sub-code word t2 from the partial set K0(¥), the code word c is expressed as 01a9 (hexadecimal notation).

As described above (in FIG. 9), a code word starts with code states 3 and 7 and shifts at the boundary. In this case, the code word states and connections are defined as follows. In other words, two code word states 3 and 7 that are referred to as code word state S0 and S1 are defined. Sub-code words shown in FIGS. 13 and 14 start with the code word state S0. Sub-code words that start with the code word state S1 represent sub-code words that start with the code word state S0 and whose bit order of elements thereof are inverted. FIG. 16 shows state transitions of code words.

In the encoding process using sub-code words, the selection of a nine-bit data sequence as elements of a partial set and the combination of sub-code words are performed in the condition that the maximum zero run length of the 16/18 encoding process is limited to up to 10.

Next, with reference to FIG. 17, a more practical example of the structure of the encoding circuit 3 shown in FIG. 6 will be described. In the example, a storing circuit 20 such as a ROM that stores a 16/18 code word table is disposed in the encoding circuit 3. With the storing circuit 20, the encoding circuit 3 encodes a 16-bit information word into a 18-bit code word c. The 16/18 code word table has partial sets of sub-code words shown in FIGS. 13, 14, and 15 and proper combinations thereof.

FIG. 18 shows another example of the structure of the encoding circuit 3. In FIG. 18, a pre-encoder 30 stores proper combinations of sub-code words shown in FIG. 15 and converts a 16-bit code word into 24-bit information. First six bits of the 24-bit information represent the state of the sub-code word h. Second six bits of the 24-bit information represent the state of the sub-code word t2. The remaining 12 bits of the 24-bit information are used to select a sub-code word corresponding to states represented by the first six bits and the second six bits.

The 24-bit information is supplied to a sub-code word generating circuit 31. The sub-code word generating circuit 31 has a storing circuit 32 such as a ROM that stores a table having sets of sub-code words. The sub-code word generating circuit 31 selects a sub-code word h from a set of sub-code words and a sub-code word for generating a sub-code word t and supplies the selected sub-code words to a code word generating circuit 33. The code word generating circuit 33 generates a 18-bit code word c corresponding to the supplied sub-code words.

In the above-described embodiment of the present invention, the present invention is applied to a digital magnetic recording/reproducing apparatus. In addition, the present invention can be applied to a digital signal transmitting apparatus having an encoding circuit that performs a channel encoding process as a combination of a partial response and maximum-likelihood decoding process.

As described above, according to the present invention, the encoding method using the 16/18 encoding process is performed in the conditions that the range of the variation of the ADS is limited, that a quasi catastrophic sequence is removed, and the maximum run length is limited. Thus, the memory of the Viterbi decoder can be prevented from overflowing. In addition, a clock signal can be stably obtained from a reproduction signal.

The 16/18 codes are codes with an encoding ratio of 8/9. Thus, the encoding ratio of the 16/18 codes is higher than that of the conventional 8/10 codes. Consequently, to obtain a high transmission rate of user data as with the conventional encoding method having a high encoding ration, in the encoding method according to the present invention, it is not necessary to increase the channel line density or the necessity of the increase of the channel line density is is suppressed.

In particular, when the present invention is applied to a digital magnetic recording/reproducing apparatus, the storage capacity for user data can be increased in comparison with the encoder using 8/10 codes without need to improve the channel line density. Thus, the storage capacity can be increased without an increase of the inter-code interference of a reproduced signal or with an suppression thereof.

In addition, according to the present invention, a 16-bit information word is converted into a 18-bit code word. Moreover, since the 18-bit code word is represented with a combination of 9-bit sub-code words, the hardware scale necessary for generating a 18-bit code word corresponding to a 16-bit information word can be reduced.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. An encoding circuit for performing a channel encoding process for a channel that is a combination of a partial response and a maximum-likelihood decoding process, comprising:

means for receiving a binary data sequence of 16-bit information words; and means for converting said binary data sequence of 16-bit information words into a binary data sequence of corresponding 18-bit code words, wherein the range of variation of an alternating digital sum of the code word sequence is limited to up to 10, any encountered quasi-catastrophic sequence is removed, and the code word sequence has a maximum zero run length that is limited to up to 10.

2. The encoding circuit as set forth in claim 1, further comprising:

means for generating each code word as a combination of 9-bit sub-code words composed of a binary data sequence;

means for converting each information word into information representable as a combination of more than one sub-code words; and means for generating each code word corresponding to the information obtained by said means for converting.

3. An encoding circuit for performing a channel encoding process for a channel that is a combination of a partial response and a maximum-likelihood decoding process, comprising:

means for defining a set of 9-bit sub-code words;

storing means for storing the set of sub-code words;

combination information generating means for converting a 16-bit information word of a binary data sequence into combination information representable by a combination of 9-bit sub-code words of said set of 9-bit sub-code words;

sub-code word generating means for selecting two sub-code words from the set stored in said storing means corresponding to the combination information and for outputting the selected sub-code words as data; and code word generating means for generating the code word corresponding to the data output by said sub-code word generating means;

wherein said 16-bit information word of a binary data sequence is converted into a corresponding 18-bit code word of a binary data sequence, wherein the 18-bit code word is generated as a combination of 9-bit sub-code words composed of a binary data sequence, and wherein a second of said combination of said 9-bit sub-code words is selected from a partial set of said 9-bit sub-code words in accordance with a value selected for a first of said combination of said 9-bit sub-code words.

4. The encoding circuit as set forth in claim 3, wherein the sub-code words are selected and the combination information are generated so that the code word exhibits limited maximum run length.

5. The encoding circuit as set forth in claim 3, wherein the sub-code words are selected and the combination information are generated so that the code word exhibits a limited range of variation of alternating digital sum.

6. The encoding circuit as set forth in claim 3, wherein said code word generating means performs a predetermined process for one of the two sub-code words that are output from said sub-code word generating means so as to generate a sub-code word "t" that comprises the second nine bits of the code word, establishes the other sub-code word as a sub-code word "h" that comprises the first nine bits of the code word, and generates the code word as a combination of the sub-code word "h" and the sub-code word "t".

7. The encoding circuit as set forth in claim 6, wherein the predetermined process is a conversion so that a condition for a trellis of the code word is satisfied at the boundary thereof.

8. An encoding method for performing a channel encoding process for a channel that is a combination of a partial response and a maximum-likelihood decoding process, comprising the steps of:

receiving a binary data sequence of 16-bit information words; and converting said binary data sequence of 16-bit information words into a binary data sequence of corresponding 18-bit code words wherein the range of variation of an alternating digital sum (ADS) of the code word sequence is limited to up to 10, any encountered quasi-catastrophic sequence is removed, and the code word sequence has a maximum zero run length that is limited to up to 10.

9. A digital signal transmitting apparatus having an encoding circuit for performing a channel encoding process for a channel that is a combination of a partial response and a maximum-likelihood decoding process, wherein the encoding circuit comprises:

means for receiving a binary data sequence of 16-bit information words; and means for converting said binary data sequence of 16-bit information words into a binary data sequence of corresponding 18-bit code words wherein the range of variation of an alternating digital sum of the code sequence is limited to up to 10, any encountered quasi-catastrophic sequence is removed, and the code word sequence has a maximum zero run length that is limited to up to 10.

10. The digital signal transmitting apparatus as set forth in claim 9, wherein the encoding circuit further comprises:

means for generating each code word as a combination of 9-bit sub-code words composed of a binary data sequence;

means for converting each information word into information representable as a combination of more than one sub-code word; and means for generating each code word corresponding to the information obtained by said means for converting.

11. A digital signal recording/reproducing apparatus having an encoding circuit for performing a channel encoding process for a channel that is a combination of a partial response and a maximum-likelihood decoding process, wherein the encoding circuit comprises:

means for receiving a binary data sequence of 16-bit information words; and means for converting said binary data sequence of 16-bit information words into a binary data sequence of corresponding 18-bit code words wherein the range of variation of an alternating digital sum of the code sequence is limited to up to 10, any encountered quasi-catastrophic sequence is removed, and the code word sequence has a maximum zero run length that is limited to up to 10.

12. The digital signal recording/reproducing apparatus as set forth in claim 11, further comprising:

analog/digital converting means for converting a signal to be recorded into a digital signal.

13. The digital magnetic recording/reproducing apparatus as set forth in claim 11, wherein the encoding circuit further comprises:

means for generating each code word as a combination of 9-bit sub-code words composed of a binary data sequence;

means for converting each information word into information representable as a combination of more than one sub-code word; and means for generating each code word corresponding to the information obtained by said means for converting.

14. A digital signal recording/reproducing apparatus having an encoding circuit for performing a channel encoding process for a channel that is a combination of a partial response and a maximum-likelihood decoding process, wherein the encoding circuit comprises:

means for defining a set of 9-bit sub-code words;

storing means for storing the set of sub-code words;

combination information generating means for converting a 16-bit information word of a binary data sequence into combination information representable by a combination of 9-bit sub-code words of the set;

sub-code word generating means for selecting two sub-code words from the set stored in said storing means corresponding to the combination information and for outputting the selected sub-code words as data; and code word generating means for generating the code word corresponding to the data output by said sub-code word generating means;

wherein said 16-bit information word of a binary data sequence is converted into a corresponding 18-bit code word of a binary data sequence, wherein the 18-bit code word is generated as a combination of 9-bit sub-code words composed of a binary data sequence, and wherein a second of said combination of said 9-bit sub-code words is selected from a partial set of said 9-bit sub-code words in accordance with a value selected for a first of said combination of said 9-bit sub-code words.

15. The digital signal recording/reproducing apparatus as set forth in claim 14, wherein the sub-code words are selected and the combination information are generated so that the code word exhibits limited maximum run length.

16. The digital signal recording/reproducing apparatus as set forth in claim 14, wherein the sub-code words are selected and the combination information are generated so that the code word exhibits a limited range of variation of an alternating digital sum.

17. The digital signal recording/reproducing apparatus as set forth in claim 14, wherein said code word generating means performs a predetermined process for one of the two sub-code words that are output from said sub-code word generating means so as to generate a sub-code word "t" that comprises the second nine bits of the code word, establishes the other sub-code word as a sub-code word "h" that comprises the first nine bits of the code word, and generates the code word as a combination of the sub-code word "h" and the sub-code word "t".

18. The digital signal recording/reproducing apparatus as set forth in claim 17, wherein the predetermined process of the code word generating means is a conversion so that a condition for a trellis of the code word is satisfied at the boundary thereof.

* * * * *